(12) United States Patent
Yokohata et al.

(10) Patent No.: US 7,057,385 B2
(45) Date of Patent: Jun. 6, 2006

(54) METHOD OF INSPECTING MAGNETIC RECORDING MEDIUM BASED ON CONTACT DURATION TIME

(75) Inventors: Toru Yokohata, Kawasaki (JP); Takahiro Imamura, Kawasaki (JP); Toshiya Fujita, Kawasaki (JP); Yojiro Ochiai, Kawasaki (JP); Masahiro Ozeki, Kawasaki (JP); Naoki Satake, Higashine (JP)

(73) Assignee: Fujitsu Limited, Kawasaki (JP)

( * ) Notice: Subject to any disclaimer, the term of this patent is extended or adjusted under 35 U.S.C. 154(b) by 253 days.

(21) Appl. No.: 10/386,637

(22) Filed: Mar. 12, 2003

(65) Prior Publication Data
US 2003/0218461 A1 Nov. 27, 2003

(30) Foreign Application Priority Data
Mar. 13, 2002 (JP) .............................. 2002-069068

(51) Int. Cl.
*G01R 33/12* (2006.01)
(52) U.S. Cl. ........................................ 324/212; 73/105
(58) Field of Classification Search ................ 324/210, 324/211, 212; 360/25, 31, 75; 73/105
See application file for complete search history.

(56) References Cited

U.S. PATENT DOCUMENTS

| | | | | |
|---|---|---|---|---|
| 4,635,136 A | * | 1/1987 | Ciampa et al. | ................ 386/64 |
| 5,640,089 A | * | 6/1997 | Horikawa et al. | .......... 324/212 |
| 5,901,001 A | * | 5/1999 | Meyer et al. | .................. 360/25 |
| 5,952,563 A | * | 9/1999 | Shiraki | ......................... 73/105 |
| 6,281,676 B1 | * | 8/2001 | Ottesen et al. | .............. 324/212 |

FOREIGN PATENT DOCUMENTS

| | | |
|---|---|---|
| JP | 7-141650 | 6/1995 |
| JP | 07-326049 | 12/1995 |
| JP | 10-227744 | 8/1998 |
| JP | 10-282011 | 10/1998 |
| JP | 2001-174415 | 6/2001 |

* cited by examiner

*Primary Examiner*—Jay Patidar
(74) *Attorney, Agent, or Firm*—Greer, Burns & Crain, Ltd.

(57) ABSTRACT

A magnetic recording medium inspection method detects small protrusions that constitute defects on the surface of a magnetic recording medium. The method includes flying a glide inspection head at a predetermined height over the surface of the moving magnetic recording medium; detecting a contact duration time during which the glide head is in contact with a protrusion on the surface of the magnetic recording medium using a contact detection sensor attached to the glide inspection head; and determining the small protrusion based on the contact duration time.

5 Claims, 12 Drawing Sheets

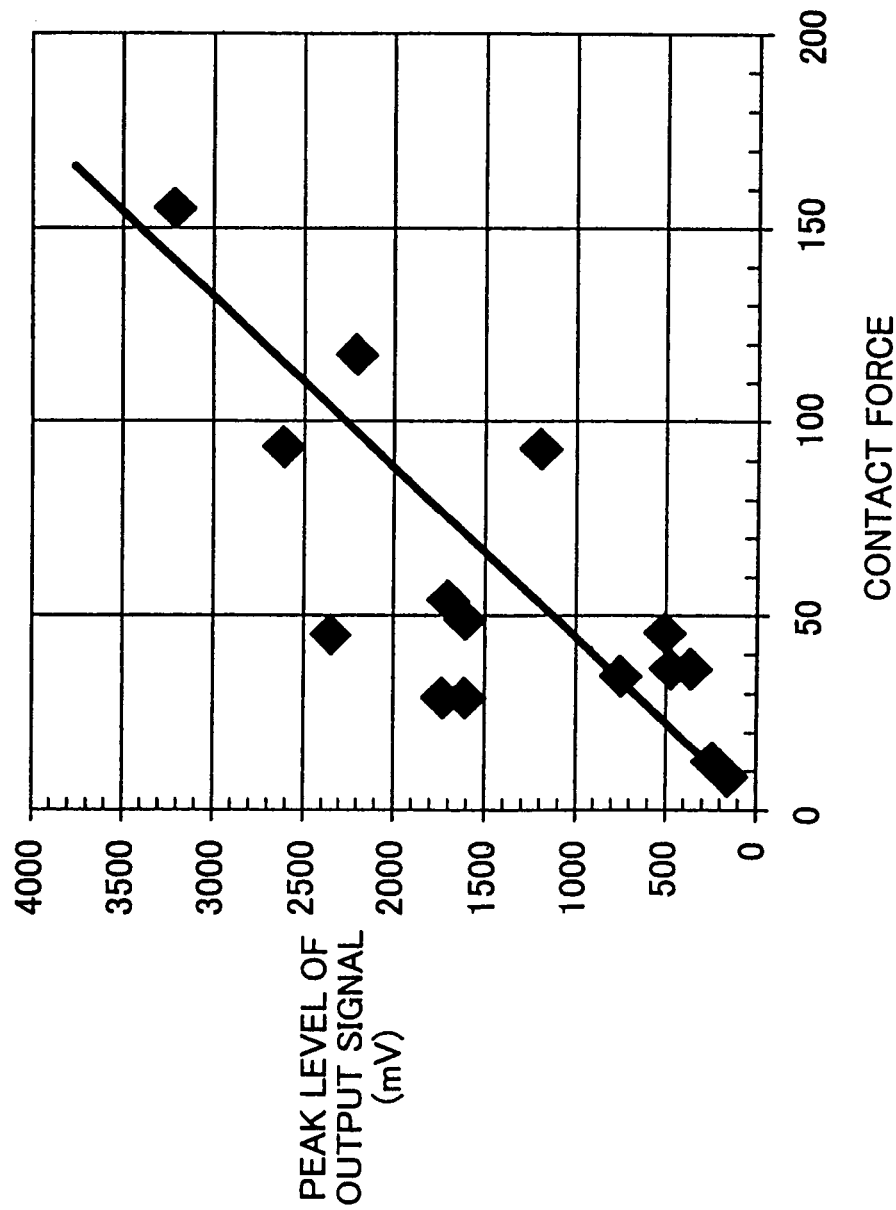

FIG.4
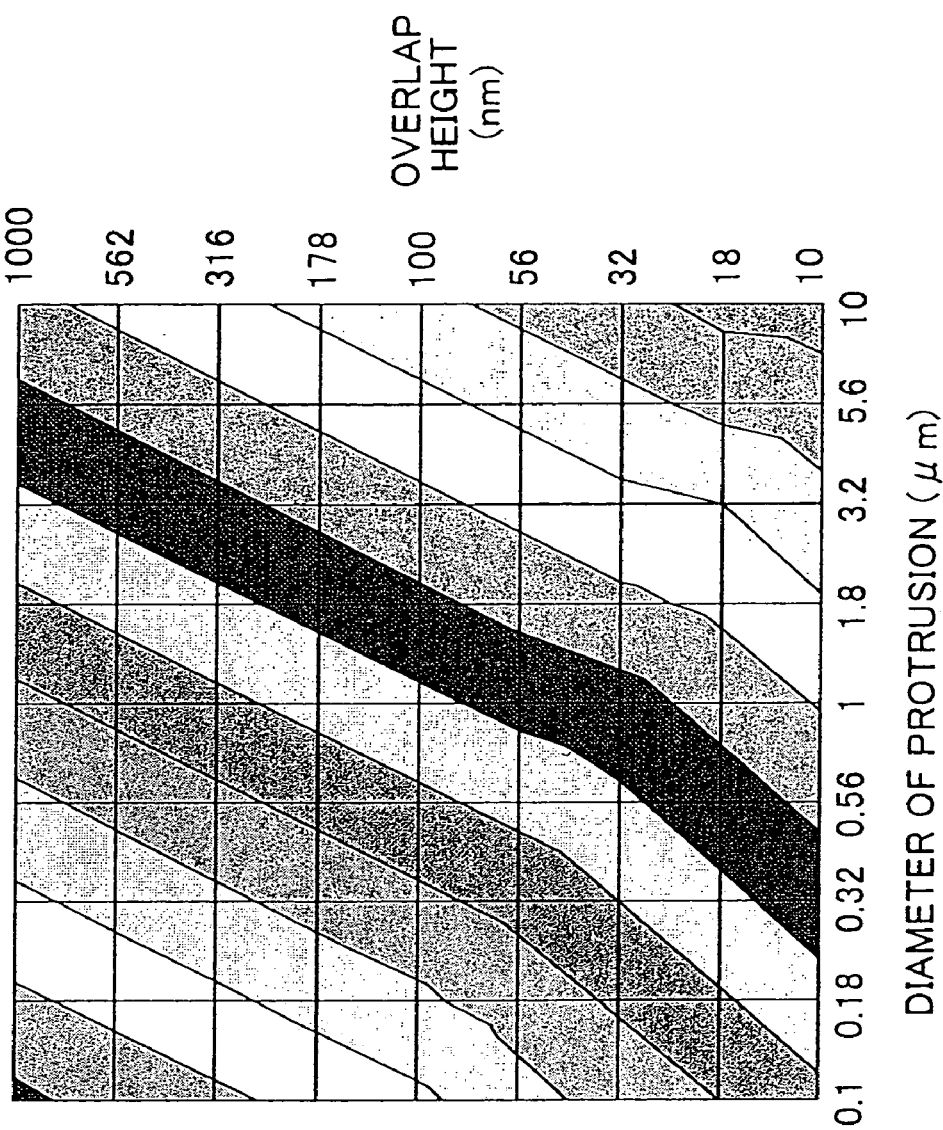
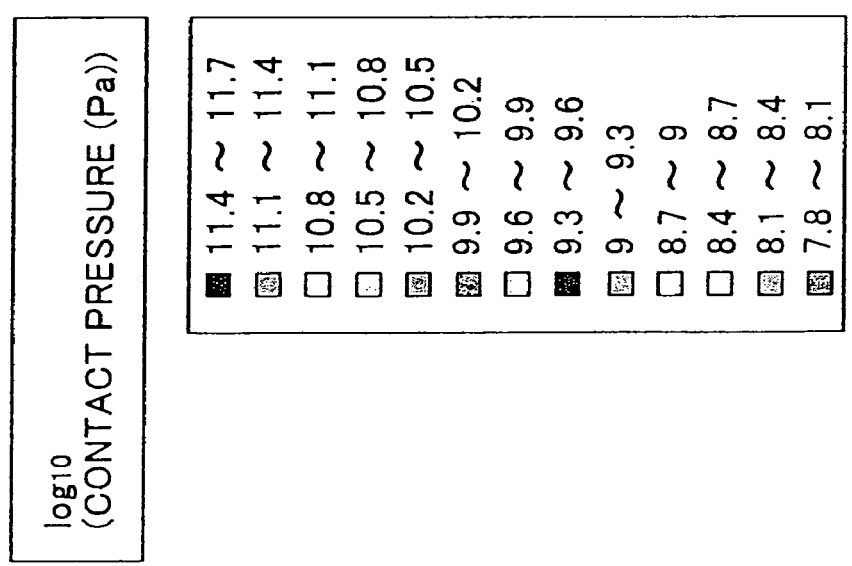

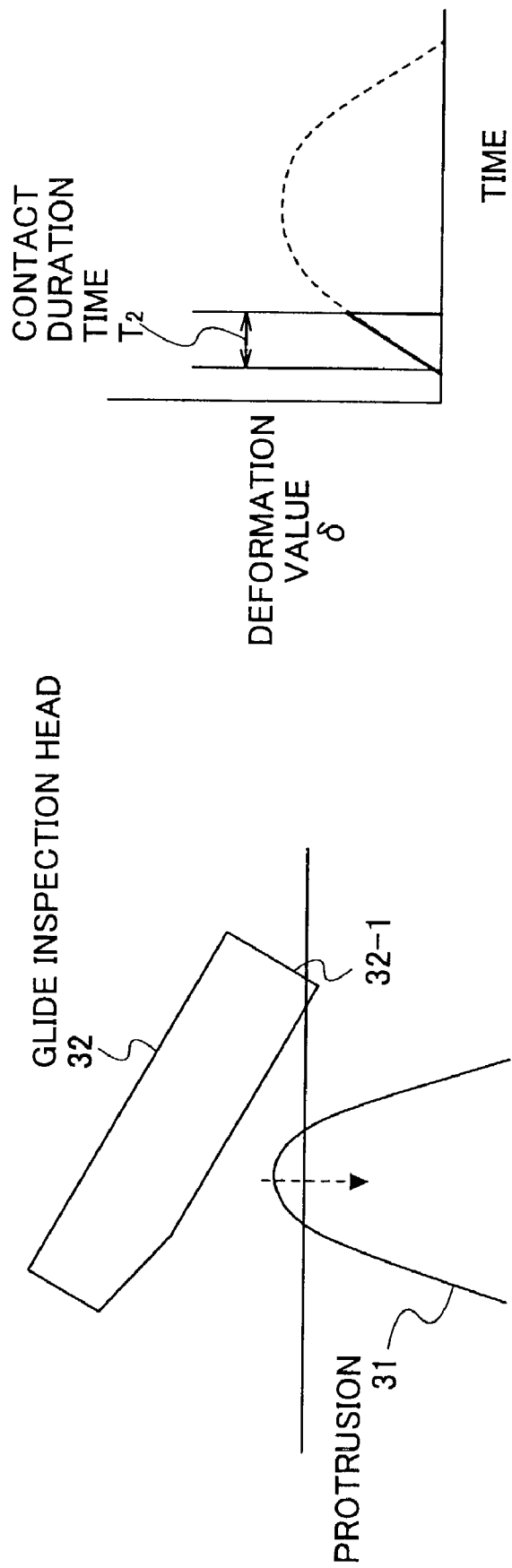

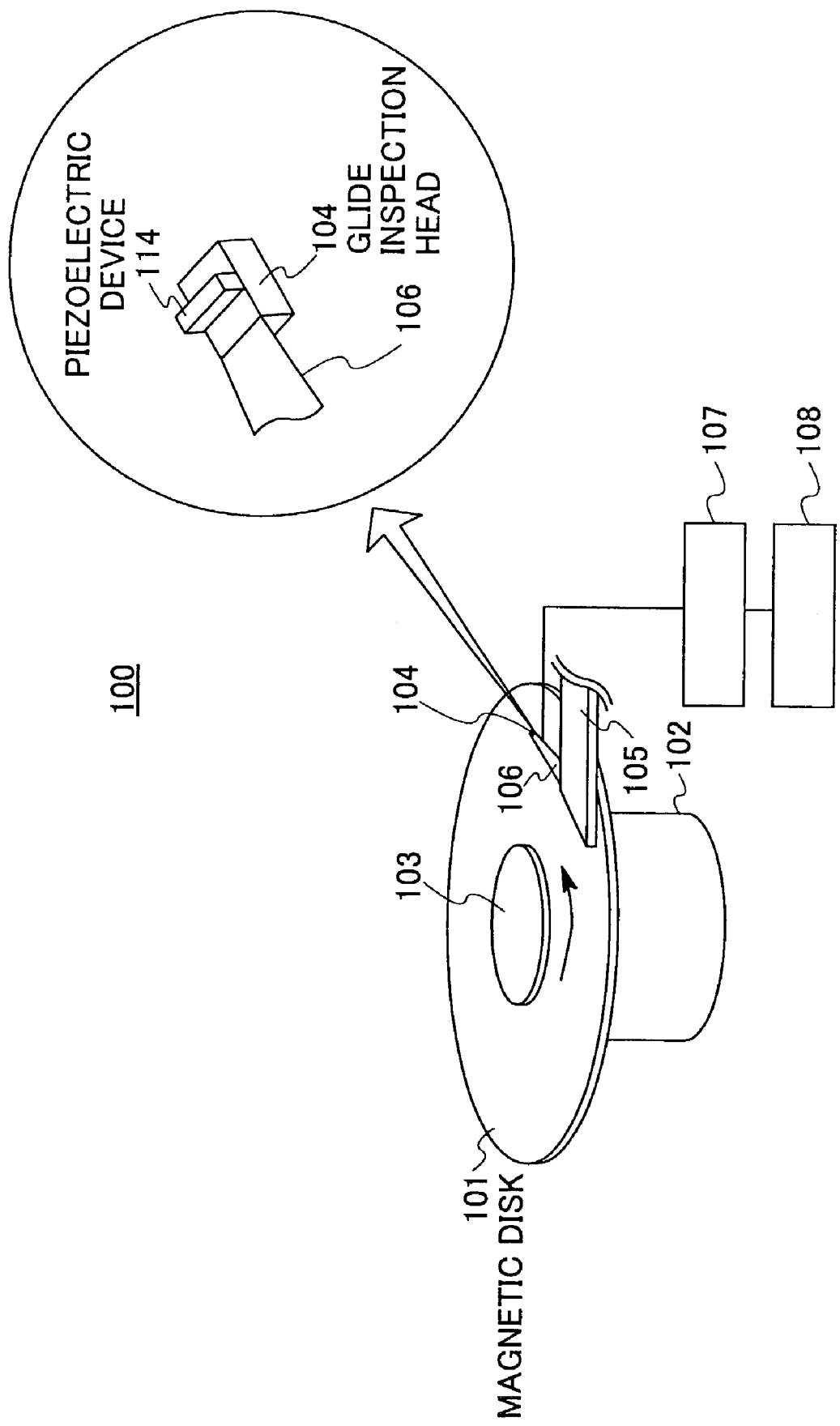

| PROTRUSION | DIAMETER OF PROTRUSION (μm) | OVERLAP HEIGHT (nm) | DURATION TIME ΔT (μsec) | PEAK LEVEL $V_p$ (mV) |
|---|---|---|---|---|
| A | 0.18 | 300 | 142 | 670 |
| B | 1.0 | 60 | 45 | 1300 |
| C | 10 | 32 | 18 | 3800 |

FIG.12

| PROTRUSION | DIAMETER OF PROTRUSION (μm) | OVERLAP HEIGHT (nm) | CALCULATED VALUE X | TIME-INTEGRATED VALUE (μs·mV) |
|---|---|---|---|---|
| A | 0.18 | 300 | 3510 | 16000 |
| B | 1.0 | 60 | 2200 | 24000 |
| C | 10 | 32 | 4160 | 40000 |

METHOD OF INSPECTING MAGNETIC RECORDING MEDIUM BASED ON CONTACT DURATION TIME

BACKGROUND OF THE INVENTION

1. Field of the Invention

The present invention generally relates to an inspection method for a magnetic recording medium provided in a magnetic recording apparatus that is used as an external storage device of a computer.

2. Description of the Related Art

Recently, information technology has been advancing and thereby it is required to increase storage capacity of magnetic recording apparatuses. In order to increase storage capacity of the magnetic recording apparatus, for example, the number of magnetic disks can be increased in a magnetic disk apparatus which is one of the magnetic recording apparatuses. However, the number of disks provided in the magnetic disk apparatus is limited because available space in the magnetic disk apparatus is limited. Therefore, it is not possible to meet a demand for increasing the recording capacity only by means of increasing the number of disks.

Therefore, it is required to increase the recording density of magnetic recording media. Conventionally, two techniques to increase the recording density of the magnetic recording media are being studied. One technique is to increase linear recording density and another technique is to increase track density.

One approach to increasing the linear recording density is to reduce magnetic spacing that is the distance between the magnetic pole surface of the magnetic head and the surface of the magnetic layer of the magnetic recording medium. The magnetic spacing is the sum of the thickness of the protection layers of the magnetic recording medium and the magnetic pole of the magnetic head and the flying height of the magnetic head. Therefore, it is required to reduce the thickness of the protection layers and the flying height of the magnetic head to reduce the magnetic spacing.

When the flying height of the magnetic head is reduced, a problem with protrusions on the magnetic recording medium appears. Therefore, an inspection is performed at the end of the manufacturing process of the magnetic recording medium to assure the smoothness of the surface of the magnetic recording medium. For example, a glide-inspection is performed for all the manufactured magnetic recording media. The glide inspection is an inspection in which relatively large protrusions on the surface of the magnetic recording medium, that might cause head crashes, are detected as defects. In the magnetic disk apparatus, the head crash means that the data write/read magnetic head comes in contact many times with relatively large protrusions on the surface of the magnetic disk and damage to the surface of the magnetic disk is expanded greatly from the protrusions, and thereby a read data error is caused, or that dust produced by the damage to the surface of the magnetic disk adheres to the flying surface of the magnetic head and therefore the stability of the flying head is lost thereby causing read data errors.

Next, the outline of the glide inspection of the magnetic disk will be explained with reference to FIGS. 1A and 1B. FIG. 1A shows a sectional diagram of an example of a magnetic disk and an example of a glide inspection head for detecting the protrusions on a surface of the magnetic disk. FIG. 1B shows an example of an output signal from a contact detection sensor on the glide inspection head.

As shown in FIG. 1A, the glide inspection head 11 is flown over the surface of the magnetic disk at a predetermined flying height from the surface of the magnetic disk 10. This flying height is referred to a flying guarantee height (a glide height 12). Attitude of the flying head 11 is such that the front part 11-1 of the flying head 11 is higher than the rear part 11-2 of the flying head 11 because air (AIR) caused by revolution of the disk flows under the flying head 11 as shown by the arrow. Therefore, the lowest point of the flying head 11 over the magnetic disk 10 is the rear part 11-2 and the distance between the rear part 11-2 of the flying head 11 and the surface of the magnetic disk 10 is the glide height 12.

If the height of the protrusion 13 on the magnetic disk 10 is higher than the glide height 12, the glide inspection head 11 comes in contact with the protrusion 13 and the shock wave propagates to a contact detection sensor 14 attached on the upper surface of a slider of the glide inspection head 11. Then, a voltage is induced in the contact detection sensor 14 and the induced voltage is the output signal supplied from the contact detection sensor 14.

FIG. 1B shows the output signal supplied from the contact detection sensor 14. The peak level 16 of the output signal greater than a predetermined threshold value 17 is detected by a signal analysis apparatus 15 connected to the contact detection sensor 14. Then, the protrusion 13 corresponding to the peak level 16 is detected as a defect.

The threshold value 17 is determined by measurement conducted as follows. First, a magnetic disk having various protrusions each of which has a diameter greater than several micrometers and the height greater than a predetermined glide height 12 is provided. Next, the magnetic disk is rotated as described in the glide inspection method. Then, when the glide inspection head 11 flying at a predetermined glide height 12 comes in contact with such protrusion, the peak level of the output signal is measured. Finally, the threshold level 17 is determined and set as a voltage that is lower than the peak level and sufficiently higher than the noise level to obtain the desired S/N ratio.

The magnetic disk having at least one such defect is usually determined to be a defective magnetic disk. These defective magnetic disks are returned for a reworking process of the surface of the magnetic disk or disposed of, and such defective disks are never integrated into the magnetic disk apparatuses. If the defective disk is integrated into the magnetic disk apparatus, the defective disk may cause a head crash.

Therefore, it is required to detect the protrusions on the magnetic disk that cause the problem to the magnetic disk apparatus by means of the glide inspection in order to reduce the flying height of the magnetic head.

On the other hand, in order to increase the track density, MR heads or spin bubble heads are employed in the magnetic recording apparatus to obtain sufficient reading output signal level when the narrow track pitch is used in the magnetic recording medium. A device part of the magnetic head consists of multi thin film layers and the protection layer is provided on the flying surface side. However, when the device part of the magnetic head comes in contact with a protrusion, the device part of the magnetic head is damaged.

A small protrusion, for example a protrusion having a small diameter, which is not detected as a defect by the conventional inspection method described above, may cause high contact pressure because the contact area is small. When the small protrusion comes in contact with the device part of the magnetic head, the device part of the magnetic head may be damaged. Furthermore, recently; the device part of the magnetic head having a width of less than 1 micrometer (μm) is being manufactured. When such a device having narrow width comes in contact with a protrusion having a diameter less than 1 μm, the device is damaged by the high contact pressure and thereby the magnetic head cannot read the signal from the magnetic recording medium.

The peak level of the output signal from the contact detection sensor caused by such a small protrusion is about a half of the conventional threshold level. Therefore, it is impossible to detect such a small protrusion by the conventional inspection method.

If the threshold level for the glide inspection is reduced to less than a half of the conventional threshold level, it may possible to detect such small protrusions. However, in this case, protrusions that are so small that the magnetic disk having such protrusions may not experience the problem even if the magnetic disk having such protrusions is integrated into the magnetic disk apparatus, may be detected as defects, or the noise signal included in the output signal from the contact detection sensor may be misdetected to be a defect. In this case, the non-defective magnetic disk is classified as a defective magnetic disk. As a result, the yield and the reliability of the glide inspection will be degraded.

SUMMARY OF THE INVENTION

It is a general object of the present invention to provide a magnetic medium inspection method in which the above disadvantages are eliminated.

A more specific object of the present invention is to provide a magnetic medium inspection method in which the protrusions that are not detected by the conventional inspection method can be precisely detected without misdetection.

Another object of the present invention is to provide a magnetic medium inspection method in which the protrusions that cause head crashes are simultaneously detected.

The above objects of the present invention are achieved by a magnetic recording medium inspection method for detecting a small protrusion that constitutes a defect on a surface of the magnetic recording medium, the method comprising steps of:

flying a glide inspection head at a predetermined height over a surface of the moving magnetic recording medium;

detecting a contact duration time during which the glide head is in contact with the protrusion on the surface of the magnetic recording medium using a contact detection sensor attached to the glide inspection head; and detecting a small protrusion based on the contact duration time.

There are various protrusions having various sizes or various heights. According to the present invention, the small protrusions that are not detected by the conventional inspection method, for example protrusions having a small diameter, can be precisely detected without misdetection.

The reason is as follows. In the case of the relatively large protrusions that can be detected by the conventional inspection method, for example protrusions having a large diameter, when the glide inspection head comes in contact with such a protrusion, the contact force is applied to the protrusion from the glide inspection head. Simultaneously, the reaction force is applied to the glide inspection head from the protrusion. Then, the flying height of the glide inspection head is increased and the glide inspection head and the protrusion are separated from each other before the bottom (lowest part) of the glide inspection head passes through the protrusion. However, in the case of a small protrusion, for example a protrusion having a small diameter, because the reaction force from the protrusion to the glide inspection head is small and elastic, the glide inspection head stays in contact with the protrusion as the bottom of the glide inspection head passes through the protrusion. Therefore, in the case of such a small protrusion, the duration time during which the glide inspection head is in contact with the protrusion is longer than in the case of a relatively large protrusion. As a result, the small protrusion can be detected according to the contact duration time.

Then, the magnetic recording media having such protrusions can be eliminated as defective media. Therefore, the device part of the MR head, and so on, provided in the magnetic recording apparatus are prevented from being damaged and thereby a malfunction in reading of data is prevented. As a result, the reliability of the magnetic recording apparatus can be increased.

The above objects of the present invention are achieved by the above mentioned magnetic recording medium inspection method, wherein the magnetic recording medium inspection method further comprises steps of:

providing a predetermined reference value for an output signal supplied from the contact detection sensor; and determining the contact duration time as a duration time during which the output signal of the contact detection sensor is larger than the predetermined reference value.

When the contact detection sensor outputs a voltage output signal, the predetermined reference voltage for the output signal level is lower than the reference voltage used in the conventional inspection method and is also lower than the output signal level supplied from the contact detection sensor in the case that the glide inspection head comes in contact with a small protrusion Therefore the predetermined reference voltage is close to the noise level included in the output signal. However, according to the present invention, the protrusions are detected according the duration time of the output signal during which the level of the output signal is greater than the reference voltage. Therefore, high frequency noise, such as noise having a short duration time, dose not affect the detection. As a result, the small protrusions on the magnetic recording medium can be precisely detected.

The above objects of the present invention are achieved by the above-mentioned magnetic recording medium inspection method, wherein the magnetic recording medium inspection method further comprises steps of:

measuring a peak level of the output signal from the contact detection sensor; and detecting a small protrusion based on the peak level of the output signal of the contact detection sensor and the contact duration time.

According to the present invention, the relatively large protrusions on the medium that cause head crashes can be simultaneously detected along with the small protrusions on the medium.

The above objects of the present invention are achieved by the above mentioned magnetic recording medium inspection method, wherein the step of detecting the small protrusion detects the small protrusion based on a linear sum of weighted values of the peak level of the output signal of the contact detection sensor and the contact duration time or a sum of weighted squared values of the peak level of the output signal of the contact detection sensor and the contact duration time.

According to the present invention, it is possible to prevent the middle size of protrusions from being detected, which protrusions do not cause problems in the magnetic recording apparatus. Therefore, both small protrusions and relatively large protrusions can be precisely detected.

The above objects of the present invention are achieved by the above mentioned magnetic recording medium inspection method, wherein the magnetic recording medium inspection method further comprises steps of:

time-integrating the output signal of the contact detection sensor for the duration time during which the output signal of the contact detection sensor is larger than the predetermined reference value to obtain a time-integrated value; and detecting the small protrusion based on the time-integrated value.

When the contact detection sensor outputs a voltage output signal, the predetermined reference voltage for the output signal level is lower than the reference voltage used in the conventional inspection method and is also lower than the output signal level supplied from the contact detection sensor in the case that the glide inspection head comes in contact with a small protrusion. Therefore the predetermined reference voltage is close to the noise level included in the output signal. However, according to the present invention, the output signal level is integrated during the time that the output signal level is greater than the reference voltage to obtain the time-integrated value. Then, the protrusions are detected according to the time-integrated value by means of comparing the time-integrated value with a threshold value. Therefore, high frequency noise, such as noise having a short duration time, does not affect the detection. As a result, the small protrusions on the magnetic recording medium can be precisely detected and the relatively large protrusions are also detected simultaneously.

BRIEF DESCRIPTION OF THE DRAWINGS

Other objects, features and advantages of the present invention will become more apparent from the following detailed description when read in conjunction with the accompanying drawings, in which:

FIG. 2 shows the relationship between the peak level of an output signal of a piezoelectric device and the contact force when the glide inspection head comes in contact with a protrusion on the surface of the magnetic disk;

FIG. 4 shows relationship among the diameter of the protrusion on the surface of the magnetic disk, the overlap height and the contact pressure between the glide inspection head and the protrusion;

FIG. 6A shows a situation where the flying glide inspection head comes in contact with a protrusion on the surface of the magnetic disk;

FIG. 6B shows the relationship between the deformation value of a protrusion and the contact duration time when the flying glide inspection head comes in contact with the protrusion on the surface of the magnetic disk;

FIG. 8 shows a glide inspection apparatus 100 used to explain the inspection method for the magnetic disks of the embodiments of the present invention;

FIG. 12 shows results of the glide inspection of the third and fourth embodiments of the present invention.

DESCRIPTION OF THE PREFERRED EMBODIMENTS

First, the principle of the present invention will be explained with reference to a magnetic disk as one example of magnetic recording media.

Various analyses have been conducted using some parameters, such as the flying height of the glide inspection head and the revolutions per minute of the magnetic disk and results shown in FIG. 2 have been obtained. FIG. 2 shows the relationship between the peak level of an output signal of a piezoelectric device and the contact force when the glide inspection head comes in contact with the protrusion on the surface of the magnetic disk. The contact force has been theoretically calculated by means of solving the non-linear equation of motion led by the elastic contact dynamics based on a force perpendicular to the contact surfaces when the glide inspection head comes in contact with the protrusion on the surface of the magnetic disk.

According to FIG. 2, the peak level of the output signal of the piezoelectric device is approximately proportional to the contact-force. In the conventional inspection method, the threshold value to be compared with the peak level of the output signal from the piezoelectric device is provided, and thereby the protrusions that cause a contact force greater than a predetermined contact force are detected.

Figure 1A:
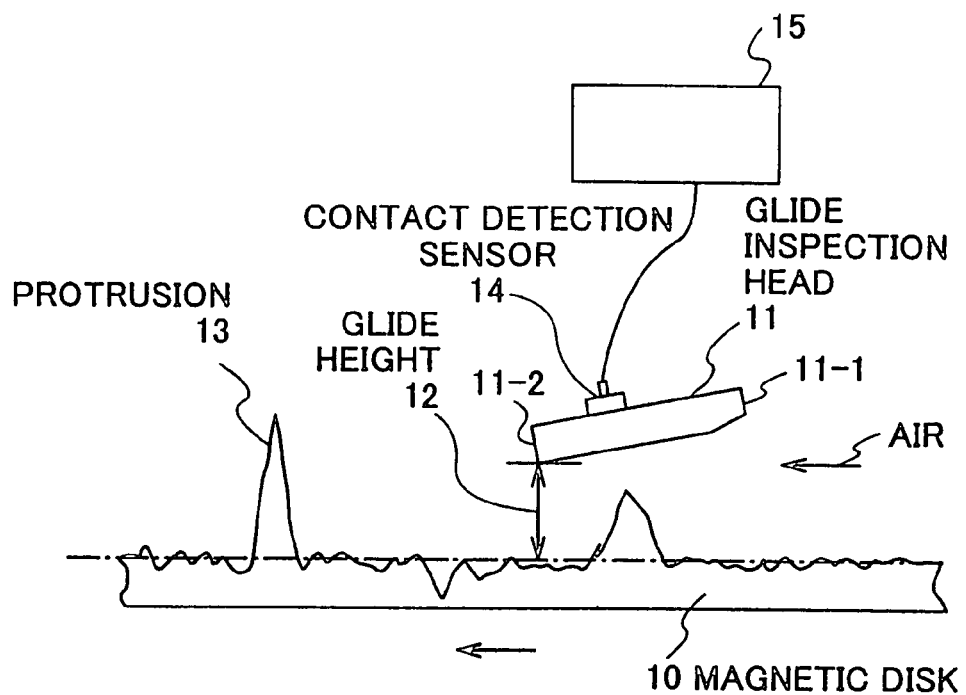
FIG. 1A shows a sectional diagram of an example of a magnetic disk and an example of a glide inspection head for detecting protrusions on a surface of the magnetic disk.
Figure 1B:
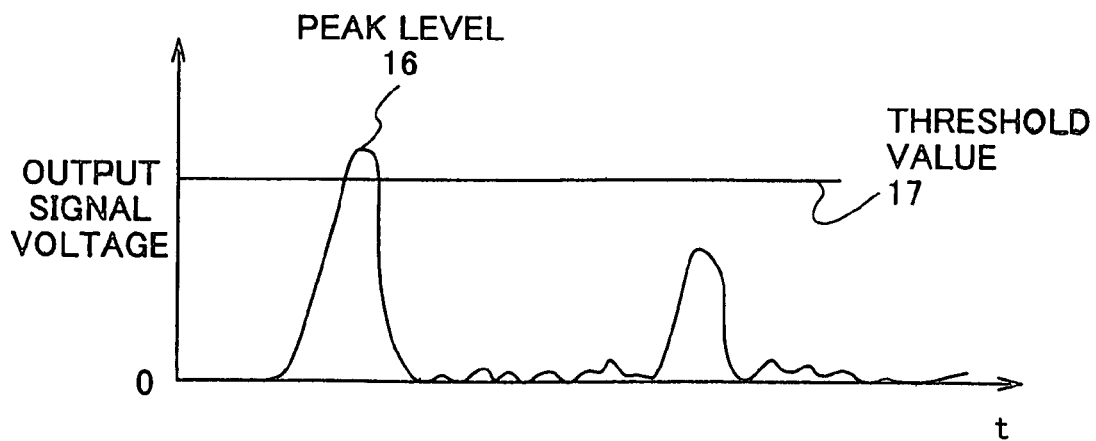
FIG. 1B shows an example of an output signal from a contact detection sensor on the glide inspection head.
Figure 3:
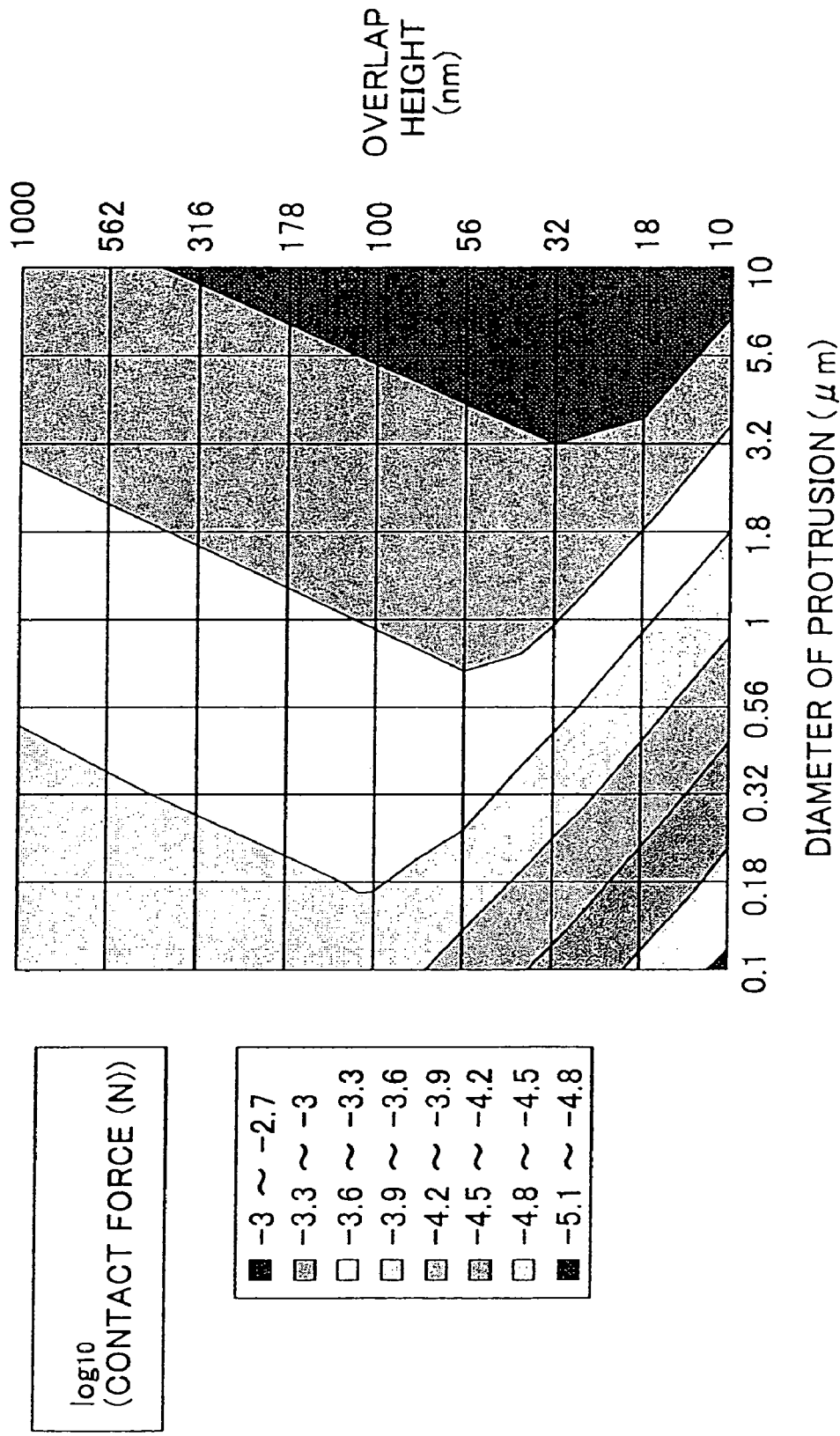
FIG. 3 shows relationship among the diameter of the protrusion on the surface of the magnetic disk, the overlap height and the contact force between the glide inspection head and the protrusion.

FIG. 3 shows relationship among the diameter of the protrusion on the surface of the magnetic disk, the overlap height and the contact force between the glide inspection head and the contact force. The contact force is expressed in $\log_{10}$(contact force (N)). The diameter of the protrusion is the diameter at the surface of the magnetic disk. The overlap height is the difference between the height of the protrusion and the glide height that is the flying height of the glide inspection head. For example, when the overlap height is positive, the height of the protrusion is greater than the glide height.

According to FIG. 3, the protrusion that causes a large contact force has a large diameter and a large overlap height.

The lower limit of the diameter of the protrusion detected by the conventional inspection method is around $\log_{10}$(contact force (N))=−3.6. Therefore, it is understood that the protrusions that are placed at the left hand of the border, each of which has a small diameter, cannot be detected by the conventional inspection method.

On the other hand, it is not the contact force itself but the contact pressure, by means of which the device part of the head, such as the MR head of the magnetic disk apparatus, is damaged when the device of the head comes in contact with the protrusion on the surface of the magnetic disk. The reason of this is as follows. Because the contact area of the narrow protrusion is smaller than that of the wide protrusion, the contact pressure of the narrow protrusion is greater than that of the wide protrusion even if the contact forces are equal to each other. Therefore, the narrow protrusion is more likely to damage the protection layer and the device of the magnetic head and to break the magnetic head than the wide protrusion.

FIG. 4 shows relationship among the diameter of the protrusion on the surface of the magnetic disk, the overlap height and the contact pressure between the glide inspection head and the protrusion. The contact pressure is expressed in $\log_{10}$ (contact pressure (Pa)).

As shown in FIG. 4, the smaller the diameter and the higher the overlap height of the protrusion becomes, the higher the contact pressure of the protrusion becomes and therefore, the probability of damage to the head such as an MR head becomes higher.

Therefore, as shown in FIG. 3 and FIG. 4, because the contact pressure between the head such as an MR head and the protrusion having a small diameter that cannot be detected by the conventional inspection method is higher than the protrusion having a large diameter, it will be understood that it is more likely to damage the device of the magnetic head. Therefore, it is required to detect such protrusions by the glide inspection and determine the magnetic disk having such a protrusion to be a defective disk.

However, a high speed sensor that generates an output signal proportional to the contact pressure cannot be employed because of its sensitivity and size. Therefore, the present invention is based on the duration time of the contact between the glide inspection head and the protrusion.

Figure 5B:
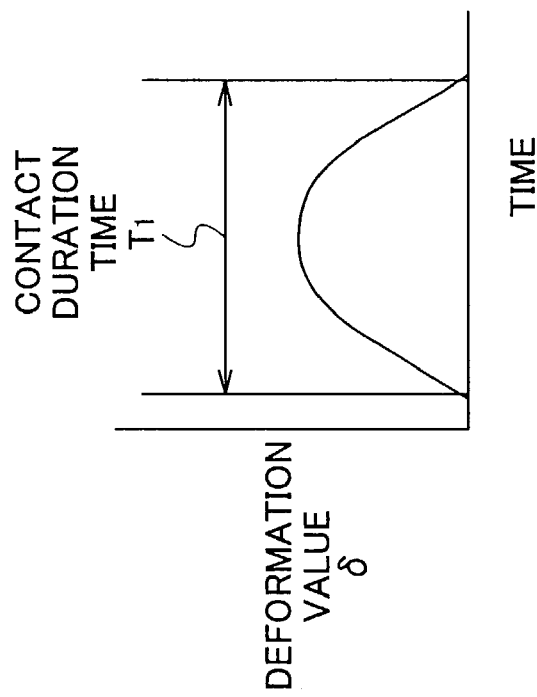
FIG. 5B shows the relationship between the deformation value of a protrusion and a contact duration time when the flying glide inspection head comes in contact with the protrusion on the surface of the magnetic disk.
Figure 5A:
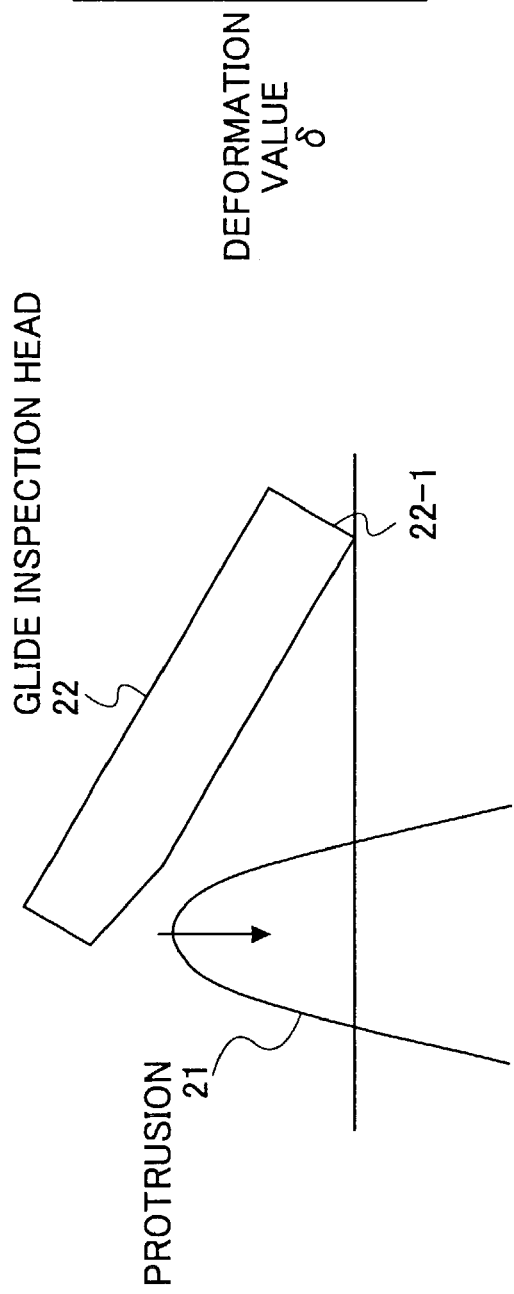
FIG. 5A shows a situation where the flying glide inspection head comes in contact with a protrusion on the surface of the magnetic disk.

The contact duration time between the glide inspection head and the magnetic disk means an elapsed time during which the glide inspection head is in contact with the protrusion on the surface of the magnetic disk. FIG. 5A, FIG. 5B, FIG. 6A and FIG. 6B show examples of different contact duration times. FIG. 5A shows the situation where the flying glide inspection head comes in contact with the protrusion on the surface of the magnetic disk in the case that the overlap height is large. FIG. 5B shows the relationship between a deformation value δ of the protrusion and the contact duration time when the flying glide inspection head comes in contact with the protrusion on the surface of the magnetic disk in the case that the overlap height is large. As shown in FIG. 5A, deformation of the protrusion 21 is started in the direction shown by an arrow with a deformation value δ when the glide inspection head 22 comes in contact with the protrusion 21. Simultaneously, the glide inspection head 22 is elastically pushed back by the protrusion 21 according to the reaction force of the contact force. The deformation value δ becomes zero when the rear part 22-1 of the glide inspection head 22 is separated from the protrusion 21. As shown in FIG. 5B, the elapsed time between the time when the glide inspection head 22 first starts coming in contact with the protrusion 21 and the time when the rear part 22-1 of the glide inspection head 22 is separated from the protrusion 21 is the contact duration time $T_1$.

On the other hand, FIG. 6A and FIG. 6B show the case where the overlap height is small and correspond to FIG. 5A and FIG. 5B respectively. As shown in FIG. 6A, the deformation of the protrusion 31 is started in the direction shown by an arrow with a deformation value δ when the glide inspection head 32 comes in contact with the protrusion 31. Simultaneously, the glide inspection head 32 is elastically pushed back by the protrusion 31 according to the reaction force of the contact force. Therefore, the rear part 32-1 of the glide inspection head 32 passes over the protrusion 31 and therefore the protrusion 31 is separated from the glide inspection head 32. As shown in FIG. 6B, the contact duration time $T_2$ corresponds to an interval shown by the bold line. In this case, the contact duration time shown in FIG. 6B is shorter than the contact duration time shown in FIG. 5B. That is to say $T_1 > T_2$. FIGS. 5A, 5B and FIGS. 6A, 6B show the case where the overlap heights are different from each other. However, the contact duration time is also dependent on the diameter of the protrusion.

Figure 7:
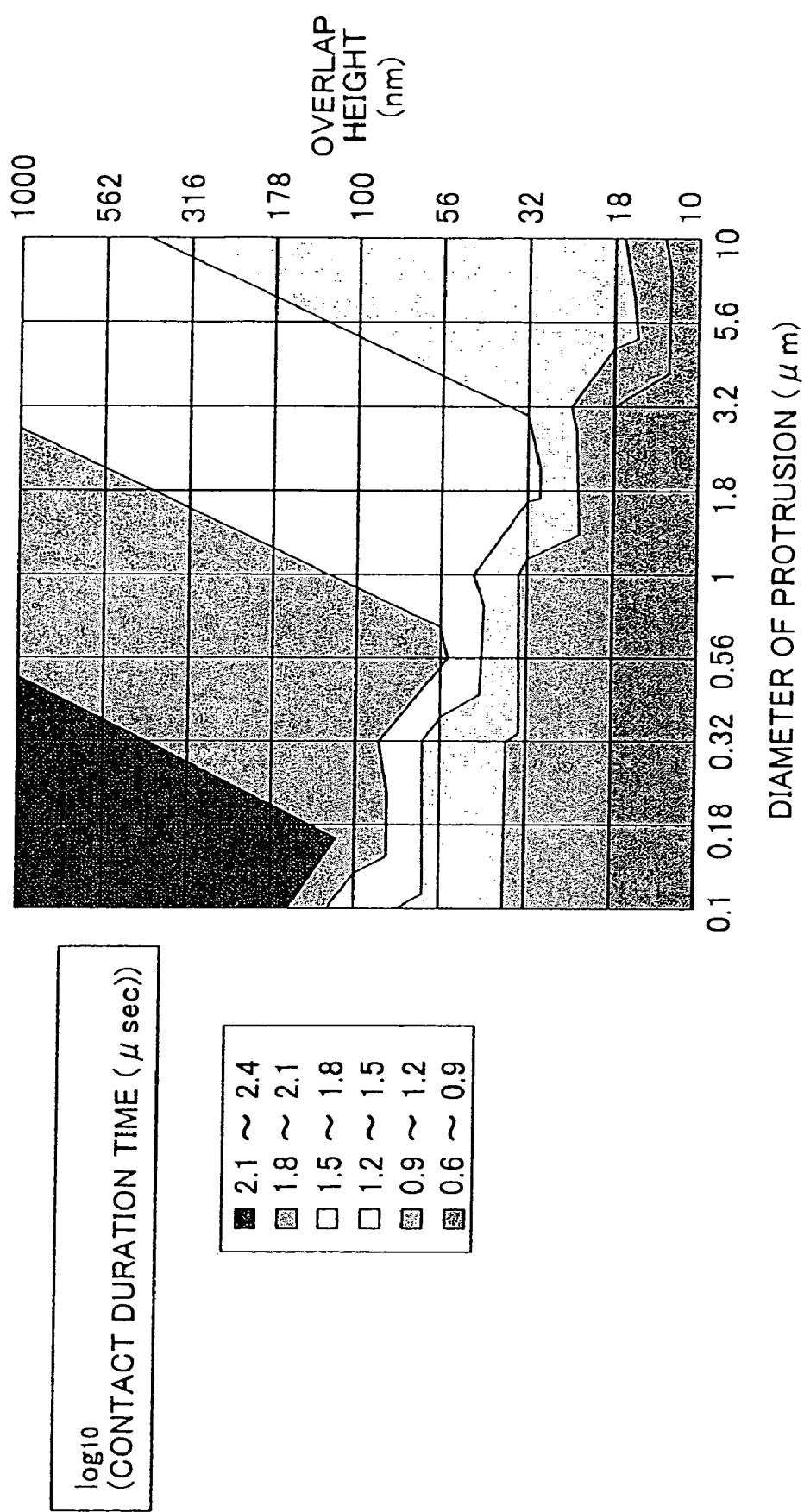
FIG. 7 shows relationship among the diameter of a protrusion on the surface of the magnetic disk, the overlap height and the contact duration time between the glide inspection head and the protrusion.

FIG. 7 shows relationship among the diameter of the protrusion on the surface of the magnetic disk, the overlap height and the contact duration time between the glide inspection head and the protrusion. The contact duration time is expressed in $\log_{10}$(contact duration time (μsec)).

Comparing FIG. 4 with FIG. 7, the correlation between the contact pressure and the contact duration time is high and especially, the correlation between the contact pressure and the contact duration time at high contact pressure is very high.

Therefore, it is possible to detect the protrusions that cause high contact pressure by measuring the contact duration time. As a result, it is possible to precisely detect the small protrusions that damage the device of the magnetic head such as the MR head.

Next, embodiments according to the present invention will be explained. Threshold values to detect the protrusions that constitute defects of one embodiment are different from those of other embodiments.

[The First Embodiment]

In this first embodiment, the contact duration time is used as a criterion to detect protrusions that constitute defects. The contact duration time is defined by the duration time that the output signal from the contact detection sensor has a level (voltage) greater than a reference voltage.

FIG. 8 shows a glide inspection apparatus 100 to explain the inspection method for the magnetic disks of the embodiments of the present invention. A magnetic disk 101 is fixed by a clamp 103 and rotated by a spindle motor 102 in the direction shown by an arrow at a predetermined number of revolutions per minute. A glide inspection head 104 is attached at the top of a suspension 106 supported by a head support arm 105. The glide inspection head 104 accesses the upper surface of the magnetic disk 101 and conducts the glide inspection over the whole area of the upper surface of the magnetic disk 101 while the glide inspection head 104 is kept opposing the magnetic disk 101 and seeking in the radial directions of the magnetic disk 101.

First, the relationship between the flying height of the glide inspection head 104 and circumferential speed of the magnetic disk is measured. Then, the revolutions per minute of the magnetic disk 101 are controlled in such a way that the circumferential speed is kept constant for each location of the glide inspection head 104 so that the flying height of the glide inspection head 104 is kept constant.

At an upper surface of the slider of the glide inspection head 104, the contact detection sensor, such as a piezoelectric device 114, is provided. When the glide inspection head comes in contact with the protrusion on the magnetic disk 101, the piezoelectric device 114 supplies an output signal. The output signal from the piezoelectric device 114 is amplified by an amplifier 107 and the amplified signal is supplied to the signal analysis apparatus 108. The signal analysis apparatus 108 detects the protrusions that constitute defects.

Figure 9A:
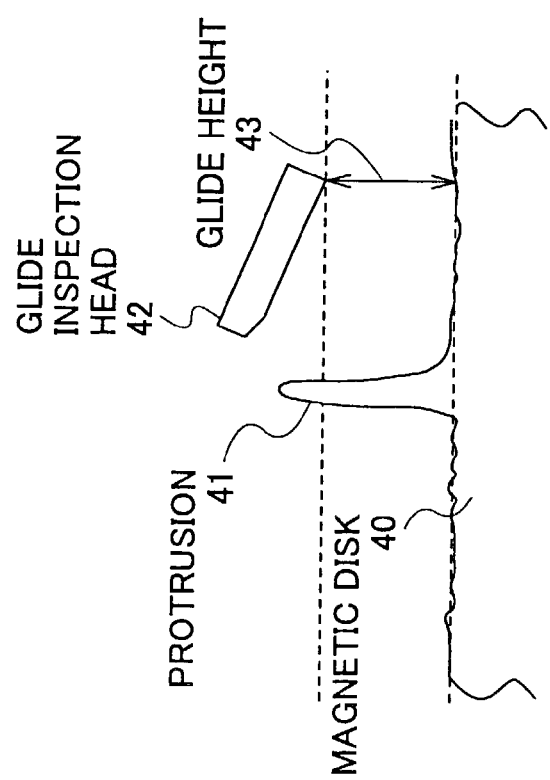
FIG. 9A shows the relationship between a protrusion on the surface of the magnetic disk and the glide inspection head of the first embodiment of the present invention.
Figure 9B:
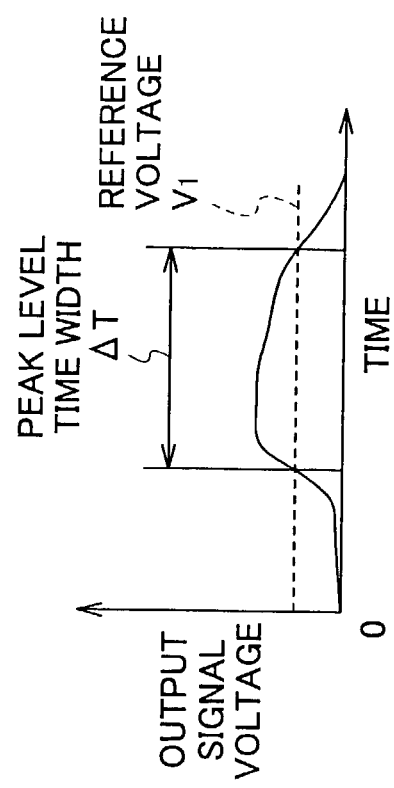
FIG. 9B shows the relationship between the reference voltage and the output signal of the piezoelectric device-in the signal analysis apparatus of the first embodiment of the present invention.

FIG. 9A shows the relationship between the protrusion 41 on the surface of the magnetic disk 40 and the glide inspection head 42 of the first embodiment of the present invention. FIG. 9B shows the relationship between the reference voltage $V_1$ and the output signal of the piezoelectric device 114 in the signal analysis apparatus 108 of the first embodiment of the present invention. As shown in FIG. 9A, the piezoelectric device 114 generates the output signal when the glide inspection head 42 that flies at the flying height 43 comes in contact with the protrusion 41. As shown in FIG. 9B, the reference voltage $V_1$ is determined for the output signal. The reference voltage $V_1$ is set to 500 mV, which value is a half of the threshold value of 1000 mV used in the conventional inspection method to detect the peak level of the output signal. The duration time of the output signal $\Delta T$ during which the output signal level is greater than the reference voltage $V_1$ is measured. A threshold value $\Delta T_{TH}$ for the duration time $\Delta T$ is set to 100 μsec. Each protrusion that corresponds to the output signal having the duration time $\Delta T$ that is longer than the threshold value $\Delta T_{TH}$ is detected as a defect.

A magnetic disk having three kinds of protrusions A, B and C was provided for conducting the measurement to collect data. The protrusion A has a small diameter and has a needle-like shape. The protrusion C has a relatively large diameter and therefore the protrusion C can be detected by the conventional inspection method. The protrusion B has a diameter and overlap height between those of the protrusion A and C. This disk was also used for the measurements for other embodiments.

The measurement of the magnetic disk having the protrusions A, B and C was conducted. Then, the diameter and the height of each protrusion were measured by using a valence force microscope. Then, the overlap height is obtained by subtracting the glide height from the height of the protrusion. The result is shown in FIG. 10.

Figures 10, 11:
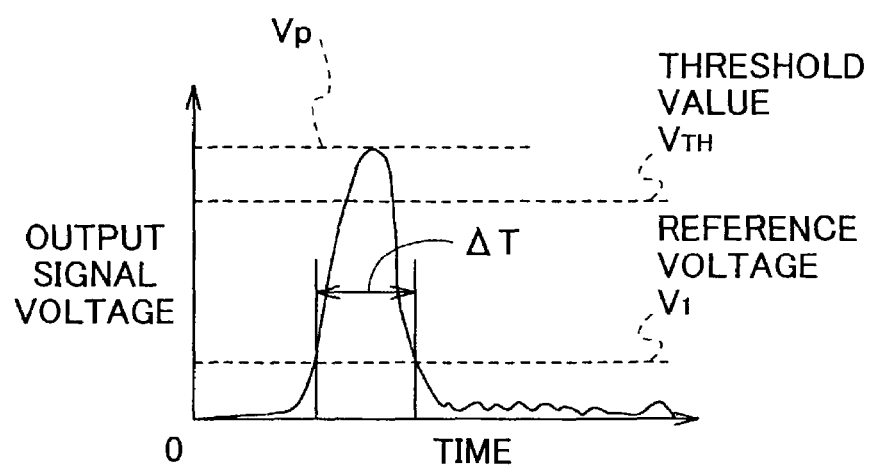
FIG. 10 shows shapes of the protrusions and results of the glide inspection of the first and second embodiments of the present invention.
FIG. 11 shows the relationship between the output signal of the piezoelectric device and the threshold values.

As shown in FIG. 10, only the protrusion A is detected as the defect in this embodiment. The protrusion has a small diameter of 0.18 μm and an overlap height of 300 nm. If the magnetic disk having the protrusion A is used in the magnetic disk apparatus, the MR head provided in the magnetic disk apparatus will come in contact with the protrusion A and the head device will be damaged. The protrusion A cannot be detected by the conventional inspection method because the output signal level from the piezoelectric device 114 is lower than the prior threshold level of 1000 mV. However, it is possible to detect the protrusion A by using the inspection method according to the first embodiment of the present invention because the duration time $\Delta T$ exceeds the threshold value of 100 μsec.

[The Second Embodiment]

In this second embodiment, the peak level of the output signal from the contact detection sensor is also used as a criterion to detect protrusions that constitute defects as well as the contact duration time $\Delta T$.

The same as described in the first embodiment, the output signal from the piezoelectric device 114 is amplified by the amplifier 107 and the amplified signal is supplied to the signal analysis apparatus 108. The signal analysis apparatus 108 detects the protrusions that constitute the defects. FIG. 11 shows the relationship between the output signal of the piezoelectric device 114 and the threshold values. As shown in FIG. 11, two threshold values are provided for the output signal. One threshold value is the threshold value $\Delta T_{TH}$ for the duration time $\Delta T$. Another threshold value is the threshold value $V_{TH}$ for the peak level Vp of the output signal. The threshold value $\Delta T_{TH}$ is set to a value of 100 μsec and the threshold value $V_{TH}$ is set to a value of 1000 mV. The reference voltage $V_1$ is set to the same value of 500 mV as described in the first embodiment. The protrusions having a duration time $\Delta T$ longer than $\Delta_{TH}$ or having a peak level Vp of the output signal greater than $V_{TH}$ are detected as defects.

The result is shown in FIG. 10. As shown in FIG. 10, the protrusions A, B and C are detected as defects. It is possible to eliminate the defective magnetic disks having the protrusion B and C as well as the protrusion A. Especially, because the protrusion C has a large diameter of 10 μm, if the magnetic disks having the protrusion C are used in the magnetic disk apparatus, the protrusions are broken by the contact between the protrusions and the magnetic head. As a result, dust caused by the contact adheres to the magnetic head and thereby the attitude of the magnetic head becomes unstable and a head crash may be caused. Therefore, according to the second embodiment, it is possible to precisely detect the small protrusions and it is also possible to precisely detect the protrusions which may cause head crashes, simultaneously.

[The Third Embodiment]

In the third embodiment, a linear sum of the weighted value of the peak level of the output signal from the contact detection sensor and the contact duration time $\Delta T$ as described in the second embodiment is used as a criterion to detect protrusions that constitute defects. The same measurements as the second embodiment were conducted. A calculated value X is equal to $\Delta T \times 20 + Vp$ ($X = \Delta T \times 20 + Vp$), where $\Delta T$ (μsec) is the contact duration time and Vp (mV) is the peak level. The threshold value $X_{TH}$ for the calculated value X is set to 3000. When the calculated value X exceeds the threshold value $X_{TH}$ equaling 3000, the corresponding protrusion is detected as a defect.

The results of the inspection are shown in FIG. 12. FIG. 12 shows results of the glide inspection of the third embodiment of the present invention.

As shown in FIG. 12, the protrusions A and C are detected as defects. The protrusion B is not detected. As described above, the protrusion B has a diameter and an overlap height between those of the protrusions A and C. A magnetic disk having such protrusion B may not be needed to be eliminated as a defective magnetic disk. As described above, in this third embodiment, it is possible to detect only the protrusions that cause problems by properly selecting the coefficients in the equation and the threshold value $X_{TH}$ described above based on the damage rate to the MR head, for example, or the rate of occurrence of head crashes during the manufacturing test.

[The Fourth Embodiment]

In the fourth embodiment, a time-integrated value of the peak level of the output signal from the contact detection sensor is used as a criterion to detect protrusions that constitute defects.

Figure 13:
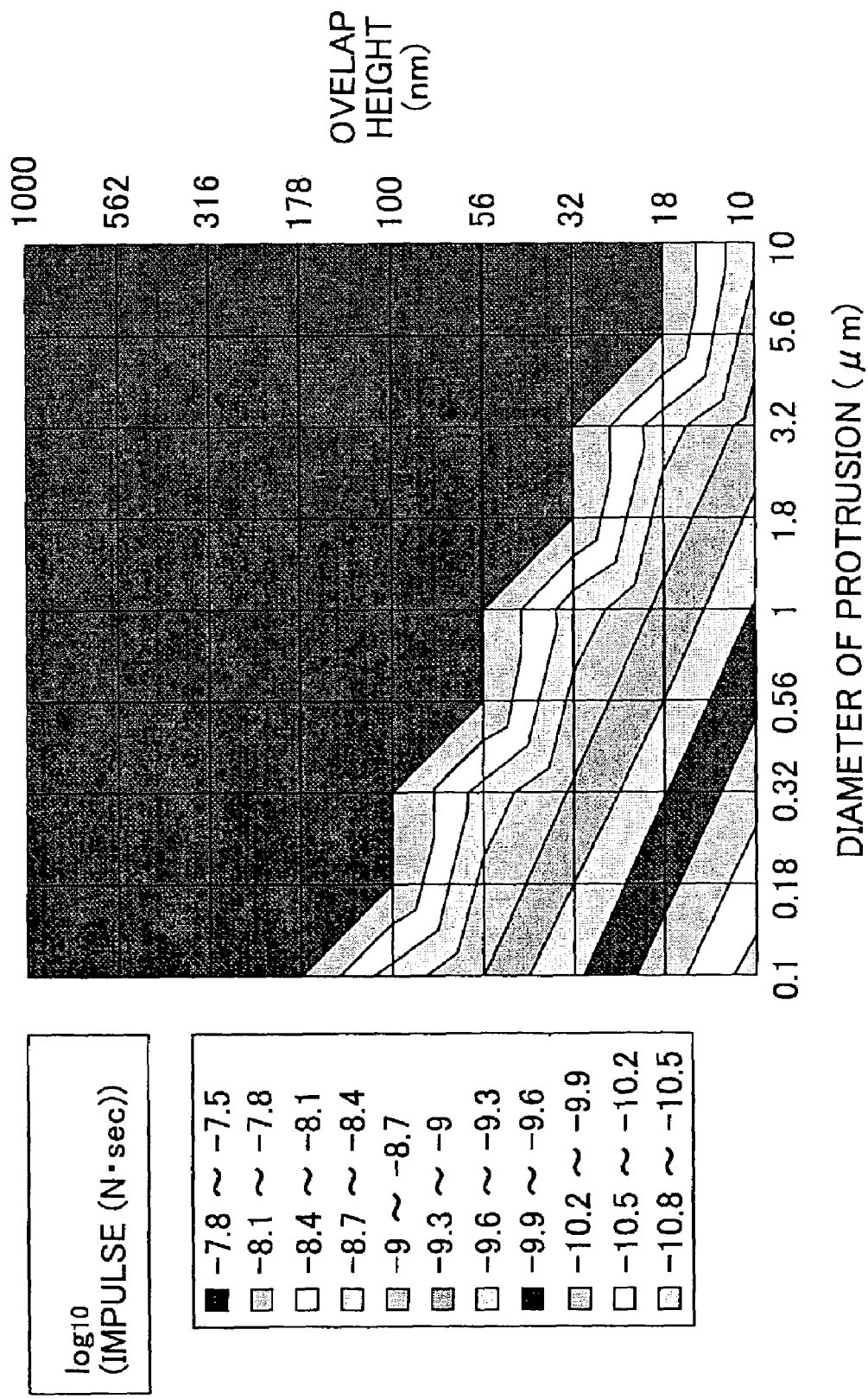
FIG. 13 shows relationship among the diameter of a protrusion-on the surface of the magnetic disk, the overlap height and the impulse between the glide inspection head and the protrusion during the contact process.

FIG. 13 shows relationship among the diameter of the protrusion on the surface of the magnetic disk, the overlap height and the impulse between the glide inspection head and the protrusion during the contact process. The impulse is expressed in $\log_{10}$(impulse (N)). The impulse is generated during the contact process between the glide inspection head and the protrusion. In FIG. 13, regions where the impulse is high and constant are regions where the contact force and contact pressure are high. Therefore, it is possible to easily detect the protrusions that may cause damage to the MR head or head crashes.

The same measurement as shown in the first embodiment is conducted. The output signal from the piezoelectric device 114 is amplified by an amplifier 107 and the amplified signal is supplied to the signal analysis apparatus 108. The signal analysis apparatus 108 time-integrates the peak level of the output signal to obtain the impulse and detects the protrusions that constitute the defects. The peak level is compared with the reference voltage $V_1$ of 500 mV which is the same reference voltage as described in the first embodiment. The peak level greater than the reference voltage $V_1$ is time-integrated to obtain the time-integrated value. For example, a threshold value for the time-integrated value is set to 1000 (μsec·mV), where the unit of time is μsec and the unit of output signal is mV. The protrusions are detected as defects when the time-integrated value exceeds the threshold value for the time-integrated value.

The results are shown in FIG. 12. As shown in FIG. 12, The protrusions A, B and C are detected as defects. Therefore, according to the fourth embodiment, it is possible to precisely detect the small protrusions and it is also possible to precisely detect the protrusions that may cause head crashes, simultaneously.

As described above, the inspection method for a magnetic medium according to the present invention can precisely detect the small protrusions on the surface of the magnetic recording medium that are not detected by the conventional inspection method. Furthermore, the inspection method for a magnetic medium according to the present invention can simultaneously detect the protrusions that cause head crashes as well as the small protrusions.

The present invention is not limited to the specifically disclosed embodiments, and variations and modifications may be made without departing from the scope of the present invention.

The present application is based on Japanese priority application No.2002-069068 filed on Mar. 13, 2002, the entire contents of which are hereby incorporated by reference.

What is claimed is:

1. A magnetic recording medium inspection method for detecting a small protrusion that constitutes a defect on a surface of a magnetic recording medium, said method comprising the steps of:

flying a glide inspection head at a predetermined height over the surface of said moving magnetic recording medium;

detecting a contact duration time during which said glide head is in contact with said small protrusion on the surface of said magnetic recording medium using a contact detection sensor attached to said glide inspection head; and detecting said small protrusion based on said contact duration time.

2. The magnetic recording medium inspection method as claimed in claim 1, further comprising the steps of:

providing a predetermined reference value for an output signal supplied from said contact detection sensor; and determining said contact duration time to be a duration time during which said output signal of said contact detection sensor is larger than said predetermined reference value.

3. The magnetic recording medium inspection method as claimed in claim 2, further comprising the steps of:

measuring a peak level of said output signal from said contact detection sensor; and detecting said small protrusion based on said peak level of said output signal of said contact detection sensor and said contact duration time.

4. The magnetic recording medium inspection method as claimed in claim 3, wherein said step of detecting said small protrusion detects said small protrusion based on a linear sum of weighted values of said peak level of said output signal of said contact detection sensor and said contact duration time or a sum of weighted squared values of said peak level of said output signal of said contact detection sensor and said contact duration time.

5. The magnetic recording medium inspection method as claimed in claim 2, further comprising the steps of:

time-integrating said output signal of said contact detection sensor for said duration time during which said output signal of said contact detection sensor is larger than said predetermined reference value to obtain a time-integrated value; and detecting said small protrusion based on said time-integrated value.

* * * * *

UNITED STATES PATENT AND TRADEMARK OFFICE
CERTIFICATE OF CORRECTION

PATENT NO.        : 7,057,385 B2                                        Page 1 of 1
APPLICATION NO. : 10/386637
DATED             : June 6, 2006
INVENTOR(S)       : Yokohata et al.

It is certified that error appears in the above-identified patent and that said Letters Patent is hereby corrected as shown below:

On the Patent Face:
Item (75)
    Under "Inventors", delete "Yojiro Ochiai" and insert --Yujiro Ochiai--.

Signed and Sealed this

Fifth Day of December, 2006

JON W. DUDAS
*Director of the United States Patent and Trademark Office*